(12) United States Patent
Pawar et al.

(10) Patent No.: US 10,119,996 B2
(45) Date of Patent: Nov. 6, 2018

(54) DATA DECIMATION SYSTEM AND METHOD FOR FACILITATING TRANSMISSION AND VIEWING OF WAVEFORMS GENERATED BY AN ELECTRICAL DEVICE

(71) Applicant: EATON CORPORATION, Cleveland, OH (US)

(72) Inventors: Saurabh J. Pawar, Pune Maharashtra (IN); Harish D. Bhattbhatt, Pune MH (IN); Vishal Bhatt, Pune MH (IN)

(73) Assignee: EATON INTELLIGENT POWER LIMITED, Dublin (IE)

( * ) Notice: Subject to any disclaimer, the term of this patent is extended or adjusted under 35 U.S.C. 154(b) by 518 days.

(21) Appl. No.: 14/224,689

(22) Filed: Mar. 25, 2014

(65) Prior Publication Data

US 2015/0276813 A1 Oct. 1, 2015

(51) Int. Cl.
*G01R 13/02* (2006.01)
*G01R 19/25* (2006.01)

(52) U.S. Cl.
CPC .......... *G01R 13/02* (2013.01); *G01R 13/029* (2013.01); *G01R 13/0272* (2013.01); *G01R 19/2513* (2013.01)

(58) Field of Classification Search
CPC .. G01R 13/02; G01R 13/0272; G01R 13/029; G01R 19/2513
USPC .......................................................... 702/67
See application file for complete search history.

(56) References Cited

U.S. PATENT DOCUMENTS

| 6,057,793 | A | 5/2000 | Gong et al. |
| 6,433,726 | B1 | 8/2002 | Fan |
| 2013/0197865 | A1* | 8/2013 | Reich ...................... G06F 17/00 702/189 |
| 2013/0346005 | A1* | 12/2013 | Cirillo ................ G01R 13/0236 702/67 |

FOREIGN PATENT DOCUMENTS

EP 1389831 A2 2/2004

OTHER PUBLICATIONS

National Instruments, "Memory Management for Large Data Sets—LabVIEW 2010 Help", URL:http://zone.ni.com/reference/en-XX/help/371361G-01/1vconcepts/memory_management_for_large_data_sets/ Jun. 1, 2010, 3 pp.

(Continued)

*Primary Examiner* — John Breene
*Assistant Examiner* — Peter Ngo
(74) *Attorney, Agent, or Firm* — Eckert Seamans

(57) ABSTRACT

A method of providing data relating to an electrical device to a client device having a certain, known pixel resolution includes receiving raw waveform data generated by a metering device in response to an event related to operation of the electrical device, the raw waveform data having a total number of data points and a waveform cycle time associated therewith, determining whether the raw waveform data should be decimated based on the total number of data points and the pixel resolution, responsive to determining that the raw waveform data should be decimated, generating decimated waveform data from the raw waveform data using the pixel resolution and the waveform cycle time. And sending the decimated waveform data to the client device.

7 Claims, 1 Drawing Sheet

(56) References Cited

OTHER PUBLICATIONS

Wattinger C. et al., "Problem-Based Learning Using Mobile Devices", Advanced Learning Technologies, 2006, Sixth International Conference on Advanced Learning Technologies, Kerkrade, The Netherlands Jul. 5-7, 2006, Piscataway, NJ, USA, IEEE, Jul. 5, 2006, 5 pp.

European Patent Office, "International Search Report and Written Opinion", PCT/US2015/014950, dated May 18, 2015, 10 pp.

\* cited by examiner

DATA DECIMATION SYSTEM AND METHOD FOR FACILITATING TRANSMISSION AND VIEWING OF WAVEFORMS GENERATED BY AN ELECTRICAL DEVICE

BACKGROUND

Field

The disclosed concept pertains generally to the monitoring of waveforms in electrical systems and, more particularly, to a data decimation technique and system for facilitating the transmission and display of waveforms, such as transient voltage spike/surge waveforms, in an electrical system.

Background Information

In the context of electrical systems, spikes, also known as surges, are fast, short duration electrical transients in voltage (voltage spikes), current (current spikes), or transferred energy (energy spikes) in an electrical circuit. Spikes can be caused by any of number of events, such as, without limitation, lightning strikes, power outages, tripped circuit breakers, short circuits, power transitions in other large equipment on the same power line, malfunctions caused by the power company, and electromagnetic pulses (EMPs).

When a spike occurs, it is important to analyze the spike in order to determine the cause and/or severity thereof. Failure to do so may lead to infrastructure damage, safety hazards, and downtime, among other issues. This is usually done by capturing a waveform representing the spike (e.g., a voltage waveform) using a metering device and analyzing that waveform at, for example, a remote location on a client device such as a PC, laptop computer, tablet or smartphone.

However, many metering devices capture the transient waveforms at a high sampling rate, resulting in a large number of data points. For example, it is not uncommon for a metering device to capture and create waveforms that constitute more than 100,000 data points in a 20 millisecond (ms) cycle time (6 MHz). In addition, the metering device may be able to operate at multiple cycle time, such as the cycle time just described and 1141 Hz, 16,666 samples per cycle, 120 ms duration cycle time. Such large amounts of data can cause traffic and/or performance problems when attempts are made to transport the data from the metering location (using a separate server or a server embedded in the metering device) over one or more networks (such as the Internet and/or a mobile data transmission network) to the target client device and display the data at the client device. For example, consider a metering device that captures and creates waveform data having 134,600 points in a 20 millisecond cycles time. If a client device having a pixel resolution of only 1920 were to try to display these point as is (i.e. without reducing them), the graph would look very dense and would therefore be difficult to read. A number of additional traffic and/or performance and usability issues may also be present, such as, without limitation, communication problems such as software breakdown, excessive cost in the case of mobile clients, and performance issues at the client device, such as excessive time required to plot data and/or to zoom in/out and pan.

SUMMARY

In one embodiment, a method is provided for providing data relating to an electrical device to a client device having a certain, known pixel resolution. The method includes receiving raw waveform data generated by a metering device in response to an event related to operation of the electrical device, the raw waveform data having a total number of data points and a waveform cycle time associated therewith, determining whether the raw waveform data should be decimated based on the total number of data points and the pixel resolution, responsive to determining that the raw waveform data should be decimated, generating decimated waveform data from the raw waveform data using the pixel resolution and the waveform cycle time. And sending the decimated waveform data to the client device.

In another embodiment, a system for providing data relating to an electrical device to a client device having a pixel resolution is provided. The system includes a metering component structured to generate raw waveform data generated in response to an event related to operation of the electrical device, the raw waveform data having a total number of data points and a waveform cycle time associated therewith, and a server component. The server component is structured to receive the raw waveform data, determine whether the raw waveform data should be decimated based on the total number of data points and the pixel resolution, responsive to determining that the raw waveform data should be decimated, generate decimated waveform data from the raw waveform data using the pixel resolution and the waveform cycle time, and send the decimated waveform data to the client device through a network.

In still another embodiment, a computer program product comprising a computer usable medium having a computer readable program code embodied therein is provided wherein the computer readable program code is adapted to be executed to implement a method of providing data as just described above.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
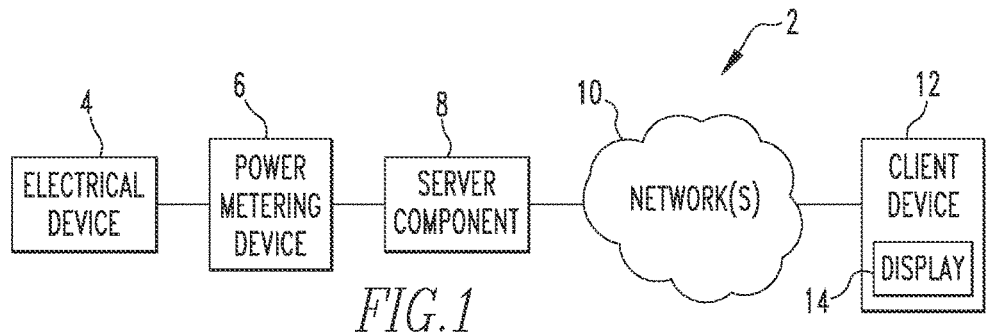
FIG. 1 is a schematic diagram of a system for facilitating the transmission and display of waveforms, such as voltage spike/surge waveforms, in an electrical system according to an exemplary embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein.

As employed herein, the term "number" shall mean one or an integer greater than one (i.e., a plurality).

As employed herein, the statement that two or more parts are "coupled" together shall mean that the parts are joined together either directly or joined through one or more intermediate parts.

As employed herein, the terms "component" and "system" are intended to refer to a computer related entity, either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution, and a component can be localized on one computer and/or distributed between two or more computers.

As employed herein, the term "pixel resolution" shall mean the number of pixel columns of a display of a client device. For example, and without limitation, a client device, such as a laptop, having a display resolution of 1280×1024, will have a pixel resolution of 1280 since it has 1280 pixel columns.

FIG. 1 is a schematic diagram of a system 2 for facilitating the transmission and display of waveforms, such as voltage spike/surge waveforms, in an electrical system according to an exemplary embodiment of the disclosed concept. System 2 includes an electrical device 4, such as, without limitation, motor systems, transformers and power converters. System 2 also includes a power metering device 6 that is operatively coupled to electrical device 4. Power metering device 6 is structured to monitor the function of electrical device 4 and capture and generate waveform data by sampling one or more outputs of electric device 4. Such waveform data may be, for example and without limitation, data representing spikes (e.g., voltage spikes, current spikes, or energy spikes) generated by electrical device 4 in response to an event such as a lightning strike, power outage, tripped circuit breakers, or power company malfunction. According to an aspect of the disclosed concept, power metering device 6 is structured to capture and generate waveform data according to one or more certain waveform cycles (e.g., 6 Hz each having a certain waveform cycle time (e.g., 20 milliseconds (ms)) and sampling rate (e.g., 120,000 samples (i.e., data points) per waveform cycle time). Suitable examples of power metering device 6 included the Power Xpert Meter 2000/4000/6000/8000, the IQ Analyzer meter, the Digitrip series meters, and the FP5000 protective relay sold by Eaton Corporation, the assignee of the present invention.

System 2 further includes a server component 8, which may be embedded in power metering device 6 or be separate from and operatively coupled to power metering device 6. Server component 8 is operatively coupled to a network 10. Network 10 may be one or more wired and/or wireless communications networks alone or in various combinations, and may include, without limitation, the Internet. Finally, system 2 includes a client device 12 that is operatively coupled to network 10. Client device 12 may be, for example and without limitation, a PC, laptop computer, tablet computer, smartphone, or another suitable computing device. According to an aspect of the disclosed concept, client device 12 includes a display 14 (e.g., an LCD) having a certain pixel resolution (e.g., 1280).

System 2 is structured and configured to facilitate the transmission and display of waveforms, such as transient voltage spike/surge waveforms, generated in response to events occurring in/at electrical device 4. More specifically, and as described in detail below (FIG. 2), system 2 is structured and configured to facilitate the transmission and display of waveforms by reducing the amount of data that is transmitted to and used by electrical device 12 for purposes of generating and displaying waveform outputs. System 2 does so by using an interval based data decimation technique to reduce the transmitted data that employs the following three data inputs: (i) the total number of data points generated by power metering device 4 during each waveform cycle, (ii) the pixel resolution of client device 12, and (iii) the waveform cycle time of power metering device 4.

Figure 2:
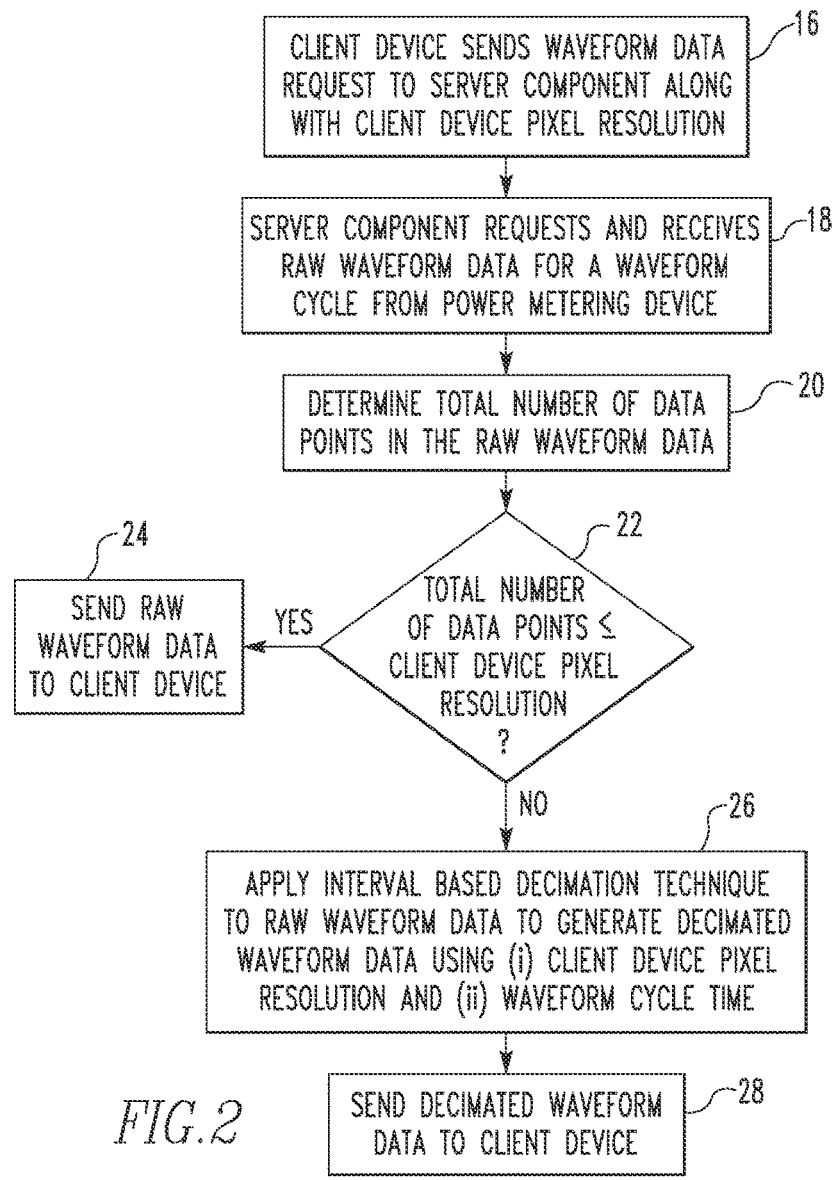
FIG. 2 is a flowchart showing a method of operation of the system of FIG. 1 according to the exemplary embodiment of the present invention.

FIG. 2 is a flowchart showing a method of operation of system 2 according to the exemplary embodiment of the present invention. The method begins at step 16, wherein client device 12 sends a request to server component 8 through network 10 for server component 8 to send it waveform data as measured by power metering device 6 (a "waveform data request"). Also at step 16, client device 12 sends information to server component 8 that specifies the pixel resolution of client device 12. Next, at step 18, and in response to the waveform data request, server component 8 requests and receives raw waveform data for the current waveform cycle from power metering device 6. That raw waveform data will include all of the data points that were sampled by power metering device 8 in the waveform cycle (e.g., 120,000 data pints in a 20 ms cycle). At step 20, server component 8 determines the total number of data points in the raw waveform data.

Next, at step 22, a determination is made as to whether the total number of data points in the raw waveform data is less than or equal to the pixel resolution of client device 12. If the answer at step 22 is yes, then that means that the raw waveform data can be plotted by client device 12 without significant issues. As a result, the method would proceed to step 24, wherein the raw waveform data is sent to client device 12 so that the data can be used to create a display of the waveform data on display 14. If, however, the answer at step 22 is no, then that means that the total number of data points in the raw waveform data is greater than the pixel resolution of client device 12. In such a situation, the raw waveform data cannot be plotted by client device 12 without significant issues. Thus, according to the disclosed concept, in such a situation, the raw waveform data is decimated before being sent to client device 12 so that it can be plotted by client device 12 without causing significant issues. More specifically, at step 26, an interval based decimation technique is applied to the raw waveform data to generate decimated waveform data using both (i) the pixel resolution of client device 12, and (ii) the waveform cycle time of power metering device 4. Then, at step 28, the decimated waveform data is sent to client device 12 so that that data can be used to create a display of the waveform data on display 14.

In one exemplary, non-limiting embodiment, step 26 is accomplished by performing the following steps. First, a decimation interval is determined by calculating a "points in one millisecond value" according to the following formula: points in one millisecond value=pixel resolution of client device/(waveform cycle time (in ms)*number of decimated data points to be generated for each decimation interval); and then calculating the decimation interval according to the following formula: decimation interval (ms)=1/points in one millisecond value. In the exemplary embodiment, a max-min decimation technique is used wherein the maximum and minimum values in each decimation interval are used to provide the decimation (i.e., they are kept with other values being discarded). Thus, in this embodiment, points in one millisecond value pixel resolution of client device/(waveform cycle time (in ms)*2). For example, if the pixel resolution of client device 12 is 1280 and the waveform cycle time of power metering device 6 is 20 ms, the points in one millisecond value will be 32 and the decimation interval will be 0.03125 ms. Alternatively, the max-min decimation technique that is employed may be customized by adding and Average (mean) point (in which case three values per interval would be utilized and the multiplier value above becomes 3) or by adding multiple max and min points. Thus, in the decimation process, the selection of points (i.e. decimation technique) can be customized according to the requirements of any particular application. After the decimation interval is determined, the decimated waveform data is created by, for each successive decimation interval of the raw waveform data from time zero and to the waveform cycle time (e.g., 0 to 20 ms), querying all data points in the subject decimation interval and determining and storing the maximum data point value in the interval, the minimum data point in the interval, and the corresponding times of these two (max and min) data points.

Thus, the disclosed concept provides a data decimation technique and system for facilitating the transmission and display of waveforms, such as transient voltage spike/surge waveforms, in an electrical system that overcomes traffic and/or performance problems that are present in many prior art approaches. The disclosed concept work with not only transient waveforms where the number of raw data points is more than client pixel resolution, but also on standard waveforms where the number of raw data points is more than client pixel resolution.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A method of providing data relating to an electrical device to a client device having a pixel resolution, comprising:
    receiving raw waveform data generated by a power metering device in response to an event related to operation of the electrical device, the power metering device being coupled to the electrical device in an electrical system and being structured to monitor function of the electrical device, the raw waveform data having a total number of data points and a waveform cycle time associated therewith;
    determining whether the raw waveform data should be decimated based on the total number of data points and the pixel resolution;
    responsive to determining that the raw waveform data should be decimated, determining a decimation interval using the pixel resolution and the waveform cycle time using the following formula: 1/(the pixel resolution/(the waveform cycle time*2)), and generating decimated waveform data from the raw waveform data using a max-min interval based decimation technique that uses the decimation interval; and
    sending the decimated waveform data to the client device.

2. The method according to claim 1, wherein the determining whether the raw waveform data should be decimated comprises determining whether the total number of data points is less than or equal to the pixel resolution and determining that the raw waveform data should be decimated only if the total number of data points is not less than or equal to the pixel resolution.

3. The method according to claim 1, wherein the raw waveform data represents a voltage waveform generated in response to a voltage spike related to operation of the electrical device.

4. A system for providing data relating to an electrical device to a client device having a pixel resolution, comprising:
    a power metering component including a power metering device structured to generate raw waveform data generated in response to an event related to operation of the electrical device, the power metering device being structured to be coupled to the electrical device and monitor function of the electrical device, the raw waveform data having a total number of data points and a waveform cycle time associated therewith;
    a server component structured to:
        receive the raw waveform data;
        determine whether the raw waveform data should be decimated based on the total number of data points and the pixel resolution;
        responsive to determining that the raw waveform data should be decimated, determine a decimation interval using the pixel resolution, the waveform cycle time and a constant multiplier value using the following formula: 1/(the pixel resolution/(the waveform cycle time*the constant multiplier value)), and generate decimated waveform data from the raw waveform data using a max-min interval based decimation technique that uses the decimation interval; and
        send the decimated waveform data to the client device through a network.

5. The system according to claim 4, wherein the server component is structured to determine whether the raw waveform data should be decimated by determining whether the total number of data points is less than or equal to the pixel resolution and determining that the raw waveform data should be decimated only if the total number of data points is not less than or equal to the pixel resolution.

6. The system according to claim 4, wherein the raw waveform data represents a voltage waveform generated in response to a voltage spike related to operation of the electrical device.

7. A computer program product, comprising a non-transitory computer usable medium having a computer readable program code embodied therein, the computer readable program code being adapted to be executed to implement a method of providing data as recited in claim 1.

* * * * *